United States Patent
Morita et al.

[11] Patent Number: 5,648,319
[45] Date of Patent: Jul. 15, 1997

[54] 1-2-3 SINGLE CRYSTAL OXIDE SUPERCONDUCTOR CONTAINING 211 PHASE AND PROCESS FOR PREPARATION THEREOF

[75] Inventors: Mitsuru Morita; Katsuyoshi Miyamoto; Kiyoshi Sawano; Shouichi Matsuda, all of Kawasaki, Japan

[73] Assignee: Nippon Steel Corporation, Tokyo, Japan

[21] Appl. No.: 496,566

[22] Filed: Jun. 29, 1995

Related U.S. Application Data

[60] Continuation of Ser. No. 75,577, Jun. 15, 1993, abandoned, which is a division of Ser. No. 635,628, filed as PCT/JP90/00580, May 2, 1990, published as WO90/13517, Nov. 15, 1990, Pat. No. 5,262,391.

[30] Foreign Application Priority Data

May 2, 1989 [JP] Japan ................. 1-111892
Sep. 19, 1989 [JP] Japan ................. 1-240658

[51] Int. Cl.$^6$ ................. H01L 39/12; C04B 35/505
[52] U.S. Cl. ................. 505/230; 505/126; 505/430; 505/729; 505/785; 252/521
[58] Field of Search ................. 505/100, 126, 505/230, 430, 729, 785, 780; 252/518, 521

[56] References Cited

U.S. PATENT DOCUMENTS

| | | | |
|---|---|---|---|
| 4,952,390 | 8/1990 | Takei | 505/450 |
| 4,956,336 | 9/1990 | Salama | 505/1 |
| 4,962,085 | 10/1990 | deBarbadillo | 505/500 |
| 4,975,416 | 12/1990 | Onishi | 505/420 |
| 5,017,548 | 5/1991 | Kirakawa | 505/401 |
| 5,037,801 | 8/1991 | Kloucek | 505/430 |
| 5,045,526 | 9/1991 | Nagesh | 505/500 |
| 5,084,436 | 1/1992 | Morimoto | 505/126 |
| 5,179,073 | 1/1993 | Yamazaki | 505/729 |
| 5,356,869 | 10/1994 | Capone et al. | 505/729 |

FOREIGN PATENT DOCUMENTS

| | | |
|---|---|---|
| 0330899 | 9/1989 | European Pat. Off. . |
| 0344812 | 12/1989 | European Pat. Off. . |
| 1298087 | 12/1989 | Japan . |

OTHER PUBLICATIONS

Hemley et al "Single–Crystal Micro–Raman Spectroscopy of Phases in the Y–Ba–Cu–O . . . " Phys. Rev. Lett., vol. 58, No. 22, 1 Jun. 1987, pp. 2340–2342.

Damento et al "Preparation of Single Crystals of Superconducting $YBa_2Cu_3O_{7-x}$ . . . " Appl. Phys. Lett. vol. 51, No. 9, 31 Aug. 1987, pp. 690–691.

Graebner et al "Thermal Conductivity of Single–Crystal & Sintered $RBa_2Cu_3O_7$ . . . " Mat. Res. Soc. Symp. Proc. vol. 99, Dec. 1987 pp. 745–748.

(List continued on next page.)

*Primary Examiner*—Paul Lieberman
*Assistant Examiner*—M. Kopec
*Attorney, Agent, or Firm*—Cushman Darby & Cushman IP Group of Pillsbury Madison & Sutro LLP

[57] ABSTRACT

Disclosed is an oxide superconductor comprising an oxide of RE, Ba and Cu, which consists of a superconductor having a texture wherein the crystal directions of the 123 phase in the matrix are uniform, large angle grain boundaries having an directional difference larger than 20° are not present and the 211 phase is finely dispersed, or an aggregate thereof, wherein the superconductor is formed into a plate or wire and the c-axis of the crystal of the formed body is uniform within ±30° to the normal of the plate face of the formed body or in the range of from 60° to 120° to said normal. Also disclosed is a process for the preparation of an oxide superconductor as set forth above, which comprises inserting a formed body as mentioned above to a heating furnace and moving a region of a temperature at which grains are formed in the 123 phase of the matrix of the formed body, i.e., through a region having a temperature of from 1050° to 910° C., having a temperature gradient of at least 2° C./cm, at a speed lower than 0.4 cm/hr from the top end of the formed body to the rear and thereof.

1 Claim, 6 Drawing Sheets

OTHER PUBLICATIONS

Jin "Large Magnetic hysteresis in a melt–textured Y–Bu–Cu–O Super . . . " *Appl. Phys. Lett.* v.54(6) Feb. 6, 1989 pp. 584–587.

Murakami "A new process with the promise of high Jc . . . " Jap Jul Appl. Phys. v.78(7) Part I Jul. 1989 pp. 1189–1191.

Lu et al "A Study of $YBa_2Cu_3O_{9-\delta}$ Type Superconducting Single Crystals" Internatn'l Journal of Modern Physics, vol. 1, No. 2, 1982 pp. 327–330.

Y. Yamada, et al., "Critical Current Density of Wire Type Y–Ba–Cu Oxide Superconductor", J.J. of Applied Physics, vol. 26, No. 5, May 1987, pp. L865–L866.

D. Dimos, et al., "Orientation Dependence of Grain–Goundary Critical Currents in $YBa_2Cu_3O_{7-\delta}$", Physical Review Letters, vol. 61, No. 2, Jul. 1988, pp. 219–222.

10μm

10μm

● : Ba
⊘ : Y
• : Cu
⊜ : O (occupied rate 0.06)
⦿ : O (occupied rate 0.63)
○ : O (occupied rate 1)

10μm

5,648,319

1-2-3 SINGLE CRYSTAL OXIDE SUPERCONDUCTOR CONTAINING 211 PHASE AND PROCESS FOR PREPARATION THEREOF

This is a continuation of application Ser. No. 08/075,577, filed on Jun. 15, 1993, now abandoned, which is a divisional application of Ser. No. 07/635,628, filed as PCT/JP90/00580, May. 2, 1990, published as WO90/13517, Nov. 15, 1990, now U.S. Pat. No. 5,262,391.

TECHNICAL FIELD

The present invention relates to an oxide superconductor composed of oxides of RE, Ba and Cu. More particularly, the present invention relates to a bulk material or wire rod having a high critical current density, in which the crystal direction is controlled over a broad region by the unidirectional solidification process of the melting method, and a process for the preparation thereof.

BACKGROUND ART

The conventional process for the preparation of a metallic superconductor wire rod or magnet is roughly divided into two types. In the case of an alloy type material, a superconductive magnet is prepared by forming the alloy type material into an ultrafine multi-core wire mainly by utilizing a plastic deformation of the metal and winding the wire into a coil. A typical example in practical use at present is an Nb—Ti alloy. In contrast, in the case of an intermetallic compound, which has a poor workability compared with the alloy type material, a process is adopted in which the starting metal is worked to some extent to form a wire rod, the wire rod is wound into a coil, the coil is subjected to a post heat treatment to obtain a superconductive phase, and a magnet is formed (the surface diffusion process, the bronze process, and the in-situ process). Attempts to apply the technique of forming wire rods of these metallic materials to oxide superconductors have been proposed (Jpn. J. Appl. Phys., Vol. 26, No. 5, 1987, pp. L865–L866), but these attempts have no substantial practical utility because the superconductive phase in the interior of the wire is composed of a polycrystal and the crystal directions are not dispersed and are not uniform.

For a practical utilization of the oxide superconductor material, a material having a high critical current density, which is prepared by the melting method, must be formed into a long wire rod or a bulk material having a large area, but since this material has a single crystal texture, it is very difficult to obtain a superconductive phase by the conventional method adopted for metal materials, which comprises wire drawing or rolling and post heat treatment. To obtain a magnetic material from such a material, a plastic working of which is difficult, it is important to increase the length or area of an oxide superconductor having a high Jc value at a high magnetic field. In view of this problem, a primary object of the present invention is to provide an oxide superconductor of the RE—Ba—Cu—O type and a process for the preparation thereof.

DISCLOSURE OF THE INVENTION

In accordance with one aspect of the present invention, there is provided an oxide superconductor comprising an oxide of RE (which represents at least one member selected from the group consisting of rare earth elements including Y), Ba and Cu, which consists of a superconductor having a texture where crystal directions of the 123 phase in the matrix are uniform, large angle grain boundaries having an azimuth difference larger than 20° are not present and the 211 phase is finely dispersed, or an aggregate thereof, wherein the superconductor is formed into a plate or wire and the c-axis of the crystal of the formed body is uniform within ±30° to the normal of the plate face of the formed body or in the range of from 60° to 120° to said normal. In accordance with another aspect of the present invention, there is provided a process for the preparation of the above-mentioned oxide superconductor, which comprises inserting a formed body obtained by quenching, solidifying and forming a melt containing said elements of RE, Ba and Cu, into a heating furnace and moving a region of a temperature at which grains are formed in the 123 phase of the matrix of the formed body, i.e., through a region of a temperature of from 1050° to 910° C., having a temperature gradient of at least 2° C., at a speed lower than 0.4 cm/hr from the top end of the formed body to the rear end thereof. According to this process, the nucleation in the 123 phase is controlled and the growth end thereof is stabilized, whereby an oxide superconductor having the above-mentioned characteristics can be formed.

BEST MODE OF CARRYING OUT THE INVENTION

The best mode of carrying out the present invention will now be described in detail.

In a bulk material prepared by the melting method, the crystal directions are uniform in a relatively broad region (about 30 mm³), and therefore, the bulk material has a high critical current density in grains. Nevertheless where this material is formed into a wire rod or a magnet, the crystal directions must be made uniform over a broader region.

The dependency of Jc on the angle of the grain boundary in the crystal has been examined at 4.2K with respect to the Y-type film (D. Dimos, P. Chaudhari, J. Mannhart and F. K. Legoues, Phy. Rev. Lett.), and the results of experiments made by them indicate that, as the deviation of the crystal azimuth, i.e., the inclination, becomes larger, the reduction of Jc becomes conspicuous. Accordingly, the crystallinity is evaluated based on the criterion that the amount of grain boundaries having a large angle is small and the crystal directions are uniform over a region broader than 50 mm$^3$. A material satisfying such requirements can be bulk material of an oxide superconductor having a high critical current density under a high magnetic field.

Figure 3:
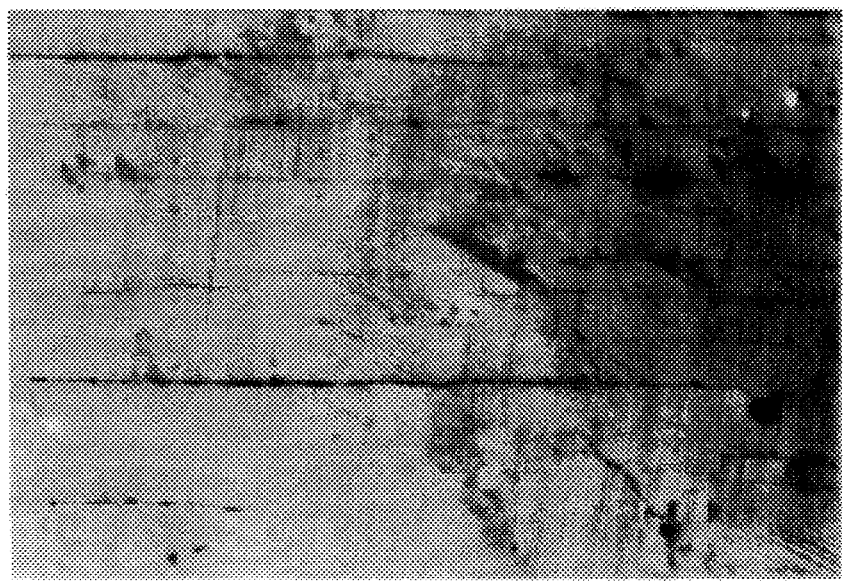
FIG. 3 is a microscope photo of a micro structure showing the state where the orientations of twin crystals are slightly different in the small inclination grain boundary.
Figure 4:
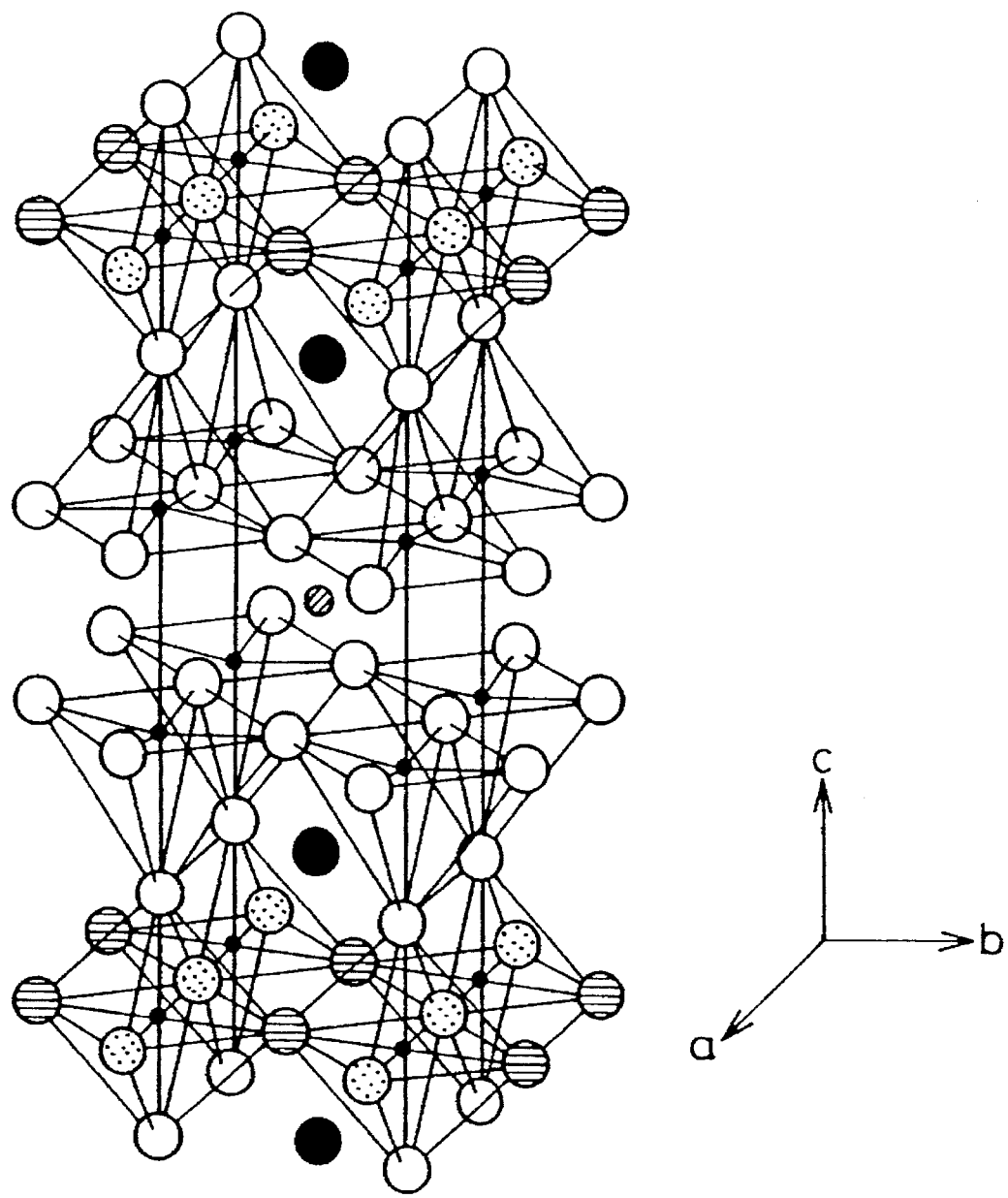
FIG. 4 is a diagram illustrating the crystal structure of $REBa_2Cu_3O_{7-y}$.
Figure 5:
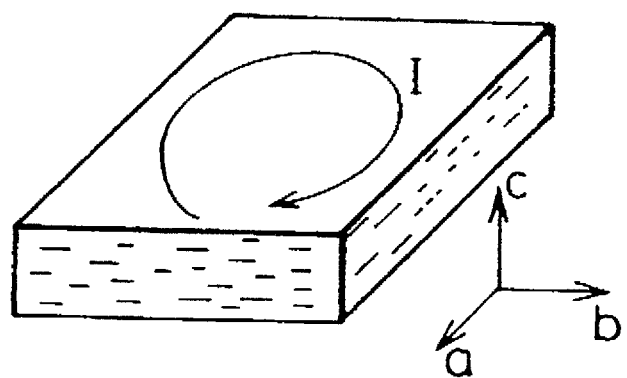
FIG. 5 is a diagram illustrating cracking and a flow of an electric current, observed when the superconductor is used as a plate magnet.
Figure 6:
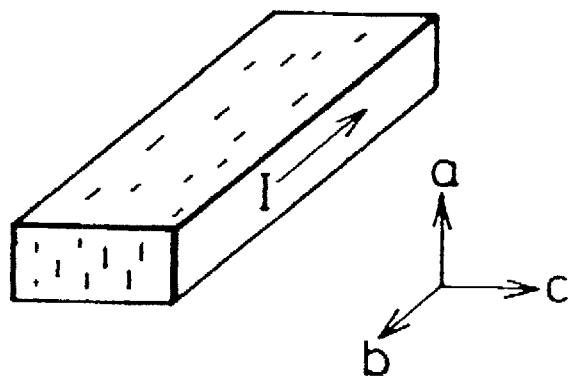
FIG. 6 is a diagram illustrating cracking and a flow of an electric current, observed when the superconductor is used as a wire rod.

The crystal structure of the superconductive phase is shown in FIG. 4. Since the superconductive phase has a layer structure, there is a large anisotropy between the direction of the a-b plane and the direction of the c-axis. Therefore, a crack as shown in FIG. 3 is often formed in the direction parallel to the a-b plane. Accordingly, a superconductive electric current must be made to flow in a direction in which the crack has no influence. Where a plate-shaped magnet is formed, an electric current must be made to flow in the state wherein the plane of the plate is maintained as shown in FIG. 5. For the above-mentioned reason, the c-axis of crystals of the superconductor must be uniform within ±30° to the normal of the plate plane of the plate-shaped formed body. Furthermore, where a material linearly cut from the plate-shaped formed body, as shown in FIG. 6, is used, an electric current must be made to flow as shown in FIG. 6, and preferably that the c-axis of crystals are uniform in the range of from 60° to 120° to the normal of the plate plane of the plate-shaped formed body.

The crystal structure of the superconductor of the present invention satisfies all of the following requirements.

Figure 2:
FIG. 2 is a microscope photo of a micro texture showing the state wherein the crystal directions are uniform in the superconductor of the present invention.

More specifically, in the superconductor of the present invention, as shown in FIG. 2, a texture of a single crystal of $REBa_2CU_3O_{7-y}$ (123 phase) having uniform crystal directions is formed over a broad region of at least 50 mm$^3$. Sometimes the crystal directions are slightly deviated during the growth, as shown in FIG. 3, but since the crystal of the present invention has a small inclination grain boundary where this deviation angle is small, the superconductive current is not disturbed.

Namely, in the superconductor of the present invention, substantially no large angle grain boundary having any directional differences larger than 20° are present and the $RE_2BaCuO_5$ (211 phase) is finely dispersed, and accordingly, a high critical current density can be obtained.

Since the c-axis of the crystals are uniform within a region of ±30° or in a region of from 60° to 120° to the normal of the plate plane of a plate-shaped or linear formed body composed of the superconductor of the present invention, a superconductive current can be made to flow without any cracking influence.

The process for the preparation of a superconductor as mentioned above will now be described.

First, a powder of REBaCuO is melted to prepare a melt containing oxides such as $RE_2O_3$, CuO and $BaCuO_2$, and then the melt is quenched by a copper sheet or a cooling roll to form a plate-shaped or linear formed body.

Thereafter, the formed body is inserted into a heating furnace, which is temperature-controlled so that a temperature gradient of at least 2° C./cm is produced in a temperature region of from 1050° to 910° C., in an oxidizing atmosphere, moved through the heating furnace at a speed lower than 0.4 cm/hr and taken from the heating furnace after it has been heated.

If the above-mentioned formed body is heated under the above-mentioned heat treatment conditions, nuclei of the 123 phase of the matrix of the formed body are grown at a speed lower than 0.4 cm/hr along a temperature gradient of at least 2° C./cm. The temperature region is limited to that of 1050° to 910° C. because the 123 phase begins to grow in this temperature region in an oxygen atmosphere. The temperature gradient is limited to at least 2° C./cm because, if the temperature gradient is smaller than 2° C./cm, the probability of a formation of nuclei from the growth ends of nuclei on a high-temperature slide is increased and the crystallinity becomes poor. The moving speed of the formed body is limited to lower than 0.4 cm/hr because the maximum growing speed in the crystal direction parallel to the a-b plane where the growing speed is relatively high, at about 0.4 cm/hr.

The formed body taken from the furnace is gradually cooled or drawn out to obtain a bulk material or wire rod having a high critical current density, which has a single crystal texture in which the $REBa_2Cu_3O_{7-y}$ (123 phase) is unidirectionally solidified and the crystal directions are uniform in a broad or long region.

As another embodiment of the above-mentioned preparation, the following heat treatment process can be adopted.

The temperature of the central portion of the heating furnace is made higher than 1050° C., and the temperature of the discharge side is lowered so that a temperature gradient of at least 2° C./cm is produced toward the discharge side of the furnace. The abovementioned formed body is placed in this furnace so that the top end portion of the formed body is located in a temperature region of from 1050° to 910° C. At the stage where nuclei of the 123 phase are formed in the top end portion of the formed body, the heating temperature is dropped at a rate of less than 0.8° C./hr while maintaining the above-mentioned temperature gradient. By this treatment, the temperature region of from 1050° to 910° C. passes through the interior of the formed body at a speed lower than 0.4 cm/hr, and a result, the 123 phase is grown at a speed lower than 0.4 cm/hr within the formed body and a single crystal texture will grow to even the rear end portion of the formed body.

In the above-mentioned process, the length of the bulk material or wire rod is restricted by the size of the heating furnace. This is because, if a formed body longer than the heating furnace is inserted and heated in the heating furnace, while the temperature of the formed body is elevated from room temperature to the furnace temperature on the inlet side of the furnace, a temperature region exists wherein the components of the formed body, $RE_2O_3$, CuO and $BaCuO_2$, react with one another to directly form the 123 phase. Even where a long furnace is used, since the growing speed of the 123 phase is very low and below 4 mm/hr, the formed body must be kept in the partially molten state for a long time, reaction with a support or reduction of the uniformity of the composition is speedily advanced, the control of the texture becomes difficult.

Figure 1:
FIG. 1 is a diagram showing a bonded texture obtained when formed bodies are piled in the partially molten state and bonded to one another in the state wherein the crystal directions are made uniform.

Accordingly, if short formed bodies are inserted in the furnace in sequence, and the formed bodies are brought into contact with and bonded to one another in the partially molten state, the superconductor of the present invention of the present invention can be prepared even by using a relatively short furnace. Namely, if the formed body is in the partially molten state [the state wherein the solid needle of $RE_2BaCuO_5$ (211 phase) is impregnated with the liquid phase of Ba and Cu oxides], the liquid phase is easily permeated into the formed body by only a slight contact with this formed body, the 123 phase grows continuously, and the formed bodies can be easily bonded. Accordingly, the formed body need not be exposed to a high temperature for a long time and an omnipresence in the composition can be reduced, and a large-area bulk material having a good crystallinity can be obtained. According to this process, for example, a bulk material as shown in FIG. 1 can be continuously prepared.

A bulk material prepared according to the melting method as in the present invention has a property such that cracking often occurs in a direction parallel to the a-b plane. Therefore, the crystal direction must be controlled so that the direction of the flow of the superconducting current is parallel to the a-b plane. Namely, in the case of a plate-shaped magnet or a wire rod, the plane of the plate-shaped bulk material must be substantially parallel or vertical to the a-b plane, as shown in FIGS. 5 and 6.

To enhance the effects of the present invention, the crystal direction is further controlled by using a seed crystal having a know azimuth.

More specifically, if such a speed crystal is brought into contact with the formed body in the semi-molten state maintained at a temperature close to the 123 phase-forming temperature, growth of the 123 phase starts from the seed crystal and the crystal direction of the formed body can be strictly controlled.

Furthermore, to stabilize the unidirectional growth of the superconductive phase, a process can be adopted in which a substance containing Ba and Cu elements is added to the formed body in the partially molten state, to control the composition of the liquid phase.

More specifically, if the formed body is kept in the partially molten state for a long time, the composition of the liquid phase is changed by a reaction of the support (platinum, alumina and the like) of the formed body with the liquid phase component of the formed body. In the present invention, to compensate this change of the composition, a substance containing Ba and Cu elements is first added to the formed body and the heat treatment then carried out, or a substance containing Ba and Cu elements is added during the heat treatment, whereby the composition of the liquid phase component is controlled and the growth of the superconductive phase is stably performed.

EXAMPLES

Example 1

A powder of YBaCuO was heat-melted at 1450° C. for 5 minutes and then quenched by a copper plate to obtain a formed body having a thickness of 1.5 mm. The formed body was cut to a length of 4 cm and a width of 2 cm, re-heated to 1100° C., and maintained at this temperature for 10 minutes. Thereafter, the temperature of the end of the formed body was dropped to 1000° C. and the formed body moved at a speed of 0.5 mm/hr along a temperature gradient of 15° C./cm, and thus, by a gradual cooling in the furnace after a termination of the growth of the crystal, a unidirectional solidification was effected a single crystal bulk material was obtained over a broad region (60 mm$^3$) as shown in FIG. 2.

Example 2

Formed bodies in the partially molten state were piled in sequence in a furnace, and a unidirectional solidification was carried out under the same conditions as described in Example 1. The texture of the bonded portion is illustrated in FIG. 1, and it can be seen that the crystal direction of the 123 phase was uniform even in the bonded portion.

Figure 7:
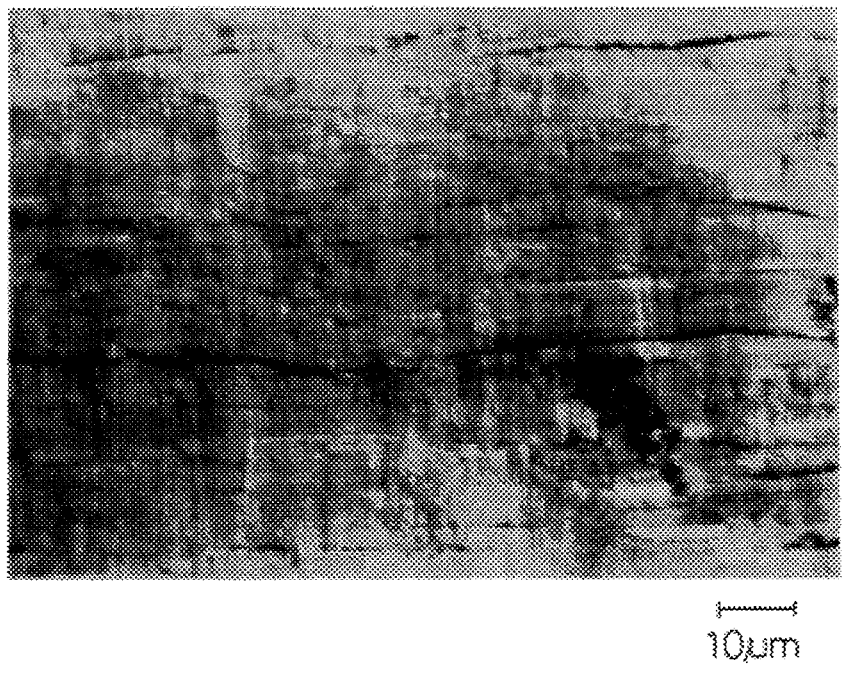
FIG. 7 is a micrograph showing the crystal structure of a sample in which the normal of a plate is substantially in agreement the c-axis.

FIG. 7 shows the material in which the a-b plane was substantially in agreement with the plane of the plate-shaped bulk material. The above-mentioned characteristic can be confirmed from the observation that the directions of the twins cross each other substantially orthogonally.

Example 3

Figure 8A:
FIG. 8(A) is a micrograph of a micro structure of a sample in which a superconductor phase is grown after the partially molten state has been maintained for 40 hours.
Figure 8B:
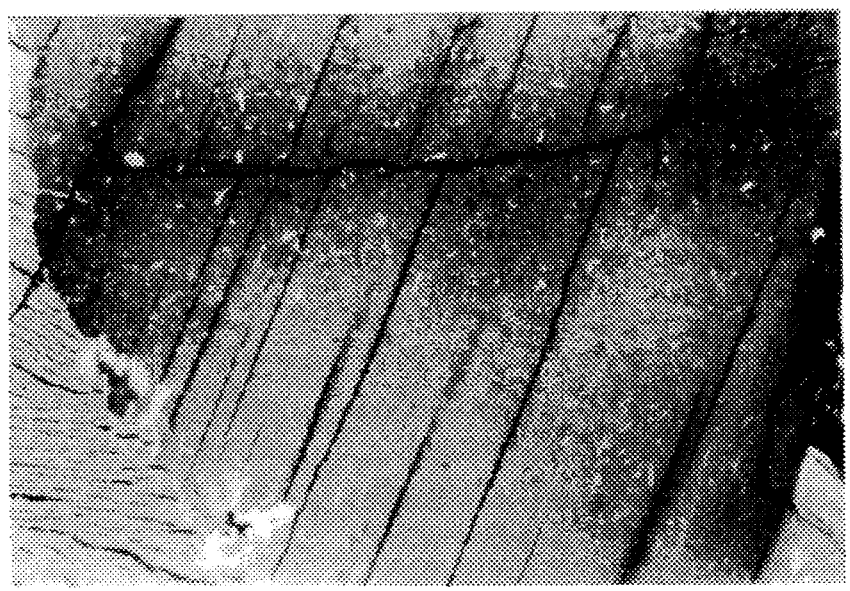
FIG. 8(B) is a microscope photo of a micro structure of a sample in which a superconductor is grown after the partially molten state has been maintained for 40 hours and barium carbonate is added.

FIG. 8(A) and 8(B) show micro graphs of a sample obtained by maintaining the partially molten state for 40 hours and growing the superconductive phase under the conditions of Example 1, without an addition of a substance, and a sample obtained by maintaining the partially molten state for 40 hours, adding barium substance, and growing the superconductive phase under the conditions of Example 1, respectively. In the case of the additive-free sample, since the partially molten state was maintained for a long time, Ba in the liquid phase reacted with the support and the amount of Ba became too low. Accordingly, the texture of the superconductive phase was disturbed, as shown in FIG. 8(A) and a crystal uniform in the azimuth of the 123 phase could not be stably grown. In contrast, in the case of the Ba-added sample, a unidirectional growth was stably achieved, as shown in FIG. 8(B).

Example 4

Y, Gd, Sm, Dy and Nd were mixed at a ratio shown in Table 1, and Ba and Cu compounds were further added to the mixture so that the RE/Ba/Cu ratio was 1/2/3. The mixture was heated and melted at 1450° C., and the melt was quenched to form a formed body having a thickness of 1 mm. The textures of the so-obtained formed bodies were roughly divided into a texture similar to the Y type texture, or a mixture of this texture with a needle-developed texture.

These formed bodies were maintained at 1100° C. for 5 minutes, and the crystal was grown at a growing speed of 0.07 cm/hr by lowering the temperature of the furnace at a rate of 1° C./hr through a temperature region of from 1100° to 950° C., along a temperature gradient of 15° C./cm, and then the treatment was carried out in an oxygen atmosphere at 600° C. for 8 hours. A texture in which the 211 phase was finely dispersed, as in the Y type texture, was obtained. The Jc was evaluated of each of the obtained samples, from the magnetization curve, and the results are shown in Table 1. As in the case of the Y type texture, a Jc as high as about $10^4$ A/cm$^2$ was obtained at 77K and 1T.

TABLE 1

| Elements | Ratio | Texture (quenched) | Jc ($10^4$ A/cm$^3$) at 77(K) and 1(T) |
| --- | --- | --- | --- |
| Y—Gd | 50:50 | granule | 0.8 |
| Y—Sm | 50:50 | needle + granule | 1.3 |
| Y—Dy | 50:50 | granule | 1.1 |
| Gd—Sm | 50:50 | needle + granule | 0.7 |
| Sm—Nd | 50:50 | needle + granule | 0.6 |
| Y—Gd—Sm | 40:30:30 | needle + granule | 1.3 |
| Y—Gd—Dy | 40:30:30 | granule | 1.0 |

As apparent from the foregoing description, according to the present invention, an increase of an area or length of a bulk material or wire rod having a high critical current density and control of the crystal direction, which is impossible according to conventional techniques, can be effectively accomplished, and the present invention can be applied to various fields and shows valuable industrial effects. For example, the following advantages can be attained.

(1) Superconductive wire rod

According to the process of the present invention, a wire rod having a high critical current density can be provided and this wire rod can be used as a long-distance transmission line.

(2) Superconductive coil

A magnet for generating a high magnetic field can be provided according to the process of the present invention.

(3) Superconductive shielding material

A large-size plate-shaped bulk material is effectively used as a magnet and a shielding material.

We claim:

1. An oxide superconductor comprising an oxide of RE (which represents at least one member selected from the group consisting of rare earth elements including Y), Ba and Cu, wherein said oxide superconductor is formed into a plate or wire comprising a single crystalline structure comprising crystal grains, wherein said single crystalline structure is of 123 phase in which 211 phases are finely dispersed, wherein angle differences between said crystal grains are less than about 20°, and the c-axis of the crystal of the formed body of said crystal grains is uniform within ±30° or within the range of from 60° to 120° to the normal of a plate face or wire face of the formed body.

* * * * *